(12) United States Patent
Kloster et al.

(10) Patent No.: US 7,320,928 B2
(45) Date of Patent: Jan. 22, 2008

(54) METHOD OF FORMING A STACKED DEVICE FILLER

(75) Inventors: Grant M. Kloster, Lake Oswego, OR (US); David Staintes, Portland, OR (US); Shriram Ramanathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/600,203

(22) Filed: Jun. 20, 2003

(65) Prior Publication Data

US 2004/0256736 A1  Dec. 23, 2004

(51) Int. Cl.
*H01L 21/30* (2006.01)

(52) U.S. Cl. ...................... 438/455; 438/456

(58) Field of Classification Search ............... 438/762, 438/765, 780, 782, 455–459, 615–617, 118, 438/406; 257/625, 676, 779–783, 784–785, 257/E27.137, E27.161, E23.023, E23.077; 428/441, 446; 148/33–33.3
See application file for complete search history.

(56) References Cited

U.S. PATENT DOCUMENTS

| | | | | |
|---|---|---|---|---|
| 5,074,947 A | * | 12/1991 | Estes et al. | 156/307.3 |
| 5,086,558 A | * | 2/1992 | Grube et al. | 29/832 |
| 5,087,664 A | * | 2/1992 | Sugino et al. | 525/124 |
| 5,514,378 A | | 5/1996 | Mikos et al. | |
| 5,726,805 A | * | 3/1998 | Kaushik et al. | 359/589 |
| 5,756,021 A | * | 5/1998 | Hedrick et al. | 264/45.1 |
| 5,763,498 A | * | 6/1998 | Knaus | 521/60 |
| 5,821,621 A | | 10/1998 | Jeng | |
| 5,846,853 A | | 12/1998 | Otsuki et al. | |
| 6,121,689 A | * | 9/2000 | Capote et al. | 257/783 |
| 6,168,737 B1 | * | 1/2001 | Poco et al. | 264/129 |
| 6,319,837 B1 | | 11/2001 | Chittipeddi et al. | |
| 6,403,382 B1 | * | 6/2002 | Zhu et al. | 436/176 |
| 6,452,650 B1 | * | 9/2002 | Nakao et al. | 349/86 |
| 6,486,903 B1 | * | 11/2002 | Wagner et al. | 347/212 |
| 6,548,176 B1 | * | 4/2003 | Gwo | 428/420 |
| 6,555,477 B1 | | 4/2003 | Lu et al. | |
| 6,570,221 B1 | * | 5/2003 | Allman | 257/347 |
| 6,696,352 B1 | * | 2/2004 | Carr et al. | 438/458 |
| 6,908,784 B1 | | 6/2005 | Farnworth et al. | |
| 2002/0015519 A1 | * | 2/2002 | Tokas et al. | 382/147 |
| 2002/0093104 A1 | | 7/2002 | Goldmann et al. | |
| 2002/0109228 A1 | | 8/2002 | Buchwalter et al. | |

(Continued)

OTHER PUBLICATIONS

Stanley Wolf PH.D and Richard N. Tauber Ph.D. in Silicon Processing for the VLSI Era, vol. 1: Process Technology, Lattice Press, 1986, pp. 539-542.

(Continued)

*Primary Examiner*—William D. Coleman
*Assistant Examiner*—Khiem D Nguyen
(74) *Attorney, Agent, or Firm*—Blakely, Sokoloff, Taylor & Zafman LLP

(57) ABSTRACT

Numerous embodiments of a stacked device filler and a method of formation are disclosed. In one embodiment, a method of forming a stacked device filler comprises forming a material layer between two or more substrates of a stacked device, and causing a reaction in at least a portion of the material, wherein the reaction may comprise polymerization, and the material layer may be one or a combination of materials, such as nonconductive polymer materials, for example.

13 Claims, 5 Drawing Sheets

U.S. PATENT DOCUMENTS

| | | | |
|---|---|---|---|
| 2002/0134503 A1* | 9/2002 | Hussinger et al. | 156/331.4 |
| 2002/0155661 A1 | 10/2002 | Massingill et al. | |
| 2002/0160139 A1* | 10/2002 | Huang et al. | 428/36.9 |
| 2003/0082904 A1* | 5/2003 | Saka et al. | 438/633 |
| 2003/0098700 A1 | 5/2003 | Yoshida et al. | |
| 2003/0138553 A1 | 7/2003 | Takenaka et al. | |
| 2003/0140959 A1 | 7/2003 | Gaudiana et al. | |
| 2003/0148596 A1 | 8/2003 | Kellar et al. | |
| 2003/0192584 A1 | 10/2003 | Beckenbaugh et al. | |
| 2003/0197941 A1* | 10/2003 | Ohgane | 359/558 |
| 2003/0203668 A1* | 10/2003 | Cobbley et al. | 439/323 |
| 2003/0215689 A1* | 11/2003 | Keegan | 429/35 |
| 2004/0077075 A1* | 4/2004 | Jensen et al. | 435/297.2 |
| 2004/0137826 A1* | 7/2004 | Gagliardi | 451/41 |
| 2004/0212030 A1 | 10/2004 | Motoo | |
| 2004/0256967 A1* | 12/2004 | Downing et al. | 313/103 R |

OTHER PUBLICATIONS

Stanley Wolf PH.D. and Richard N. Tauber PH.D. in Silicon Processing for the VLSI Era, vol. 1: Process Technology, Lattice Press, 1986, pp. 430-441, 518-9.

Office Action for U.S. Appl. No. 10/814,083 mailed May 30, 2006 (11 pages).

\* cited by examiner

METHOD OF FORMING A STACKED DEVICE FILLER

BACKGROUND

In the manufacture of microelectronic devices, packaging density is becoming increasingly important. Stacking of the dice of a multi-processor microelectronic device is one way to improve the packaging density of a microelectronic device. Stacked microelectronic devices are typically formed by stacking two or more wafers with integrated circuitry formed thereon, forming bonded wafers, and then dicing the stacked wafers into individual stacked devices. FIG. 5 illustrates a stacked microelectronic device 236, which may result from the fabrication technique briefly described above. Device 236 comprises a first microelectronic die 216 having an active surface 218, and an integrated circuitry layer 222, which contains integrated circuitry not shown in detail. Typically, the integrated circuitry layer is formed to a depth of approximately 10 microns. An interconnect layer 224 is formed on the die 216, and is illustrated as a plurality of interconnect structures, but may additionally comprise multiple layers of conductive traces separated by dielectric material (not shown). The interconnect layer 224 provides routes for electrical communication between integrated circuits, integrated circuit components, and external devices, for example.

Device 236 comprises a second microelectronic die 202, which additionally contains an integrated circuitry layer 208 and an interconnect layer 212. The physical attachment of interconnect layer 224 to interconnect layer 212 may electrically interconnect integrated circuitry layer 222 with integrated circuitry layer 208. Die 202 may be thinned, prior to dicing, and a plurality of conductive vias 228 may be formed on the back surface 226 to be in electrical contact with the integrated circuitry layer 208. A plurality of solder balls 232 may be formed such that one or more solder balls are in electrical contact with one or more vias. Formation of the plurality of vias 228 and plurality of solder balls 232 may make it possible to route input/output signals, power, and ground to and from the integrated circuitry layers, for example.

Typically, thinning of one of the stacked wafers is performed by use of one or more mechanical and/or chemical processes, such as a polishing process, for example. These processes may cause mechanical stresses in the unsupported portions of the wafer being thinned. Unsupported portions of the wafer may include, for example, the areas of the wafer not supported by interconnect structures, for example. These mechanical stresses may result in undesirable effects such as chipping, cracking, or other mechanical damage, which may result in the wafer and/or individual stacked devices being unusable. A need, therefore, exists for a method of forming stacked devices that reduces or eliminates these undesirable effects.

BRIEF DESCRIPTION OF THE DRAWINGS

The subject matter regarded as particular embodiments are particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Embodiments of the claimed subject matter may comprise a method of forming a stacked device filler. In one embodiment, a method of forming a stacked device filler comprises forming a material layer between two or more substrates of a stacked device, and causing a reaction in at least a portion of the material, wherein the reaction may comprise polymerization and the material layer may be one or a combination of materials, such as nonconductive polymer materials, for example.

Figure 5:
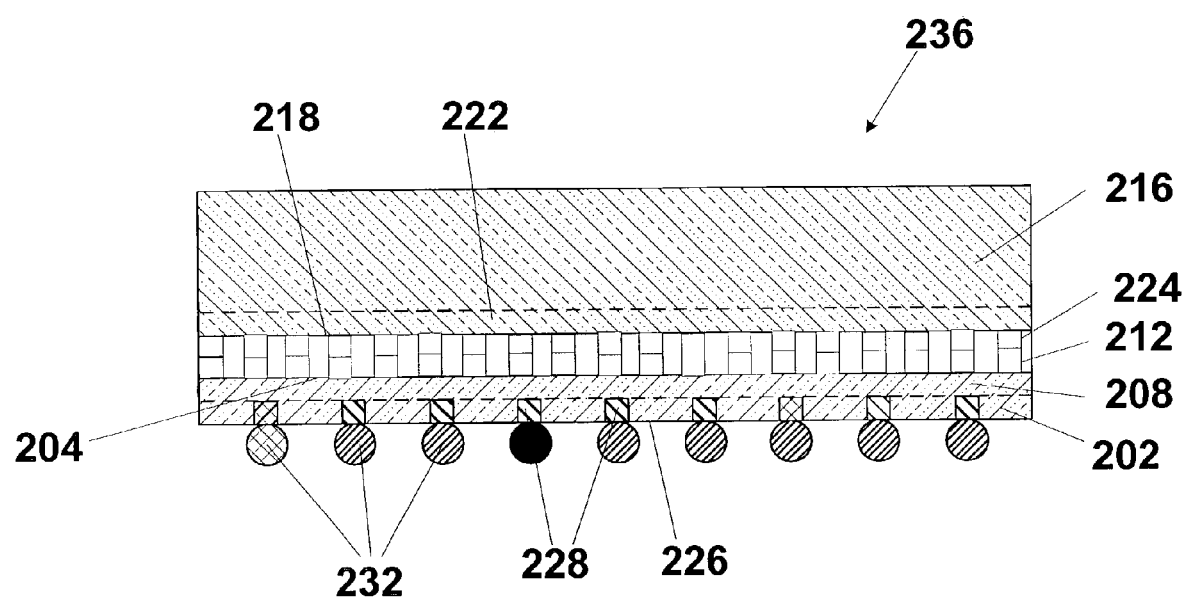
FIG. 5 is an illustration of stacked microelectronic device, as known in the art.

As mentioned previously, during fabrication of a device such as a stacked microelectronic device, one or more fabrication processes may cause mechanical stress in one or more of the stacked wafers, which may result in physical damage. One such fabrication process is a thinning process, typically performed on one of the stacked wafers prior to dicing of the wafers into individual stacked devices. As illustrated in FIG. 5, die 202 is substantially thinner than die 216, but die 202 may initially be the same thickness as die 216 when initially assembled into stacked wafers. For example, both die 202 and die 216 may be 700 to 800 microns thick prior to dicing and thinning, and die 202 may subsequently be thinned to a thickness of 10 to 100 microns, in order to allow for the formation of conductive vias and provide communications routes for the stacked device, as explained previously. During the thinning process, which may comprise chemical mechanical polishing (CMP), grinding, or a silicon wet etch, for example, unsupported regions between interconnect structures may flex, which may cause portions of the die 202 to crack or chip. This physical damage to die 202 may reduce or destroy the functionality of the die, and may additionally cause contaminant incursion, resulting in damage to other dies on the wafer, for example.

As will be understood by those of skill in the art, microelectronic wafers used in one or more of the following embodiments may include any substrate capable of having integrated circuitry formed thereon, including silicon, germanium, indium telluride, or gallium antimonide, to cite just a few examples. Additionally, it will be understood that circuitry formed on substrates such as those described may be any circuitry, including circuitry used in central processing units (CPUs), chipsets, memory or application specific integrated circuits (ASICs). Finally, it will be understood that the individual dies of devices formed in accordance with one or more of the following embodiments may comprise identical or differing integrated circuits, for example.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of embodiments of the claimed subject matter. It will be understood by those skilled in the art, however, that certain embodiments may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Figure 1:
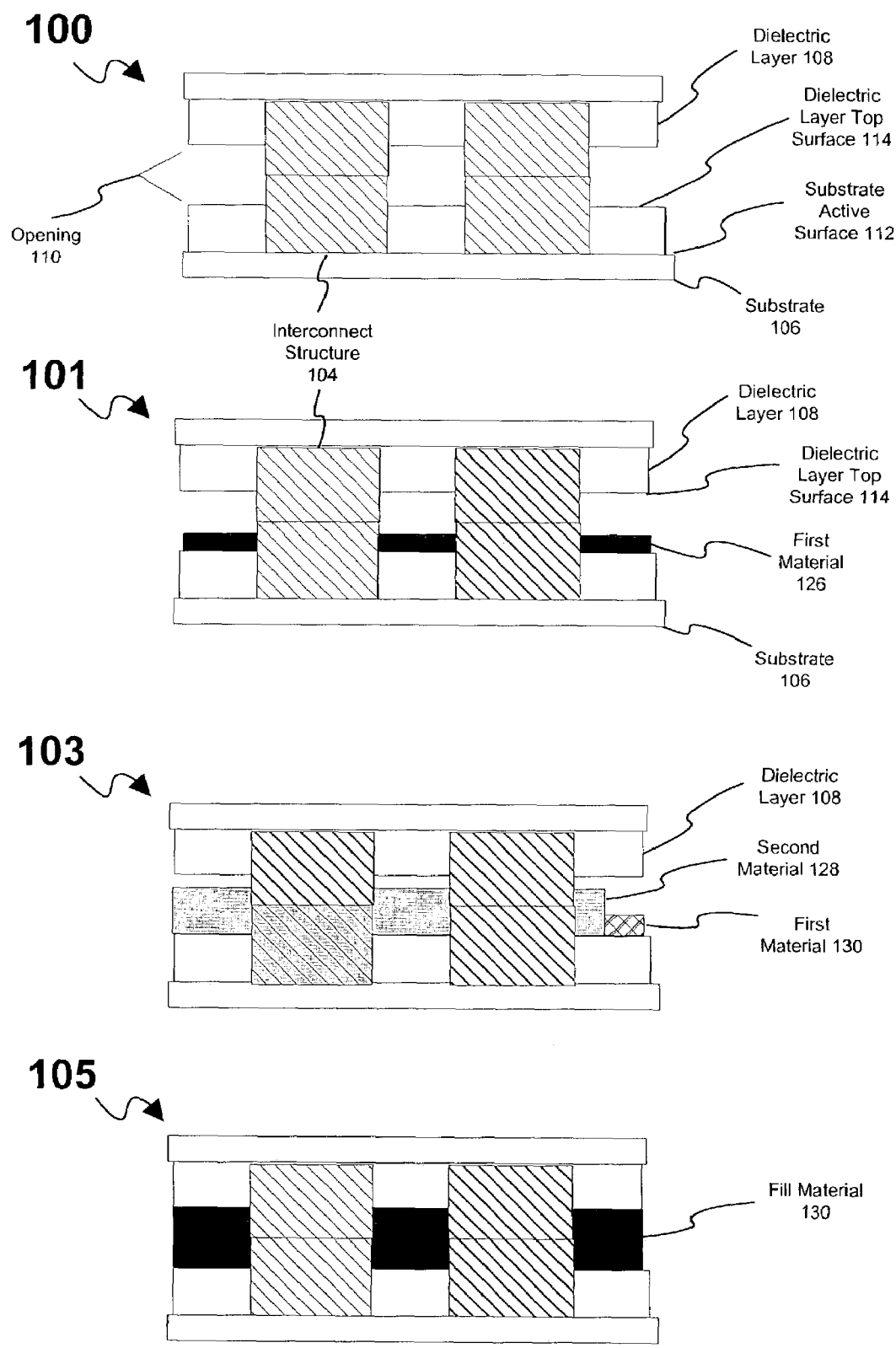
FIG. 1 illustrates several phases of formation of a stacked device filler in accordance with at least one embodiment.

Referring now in detail to the drawings wherein like parts are designated by like reference numerals throughout, there is illustrated in FIG. 1, several phases in the formation of a stacked device having a filler, in accordance with at least one embodiment. Stacked device 100 comprises two substrates 106, each with a dielectric layer 108 and interconnect structures 104 formed thereon. Substrates 106 may comprise semiconductor substrates such as silicon substrates, for example, and may each comprise a portion of a silicon wafer after patterning of interconnects and formation of a dielectric layer, for example. Substrates 106 may have an active surface 112, and one or more integrated circuitry layers, which may contain integrated circuitry not shown in detail. Although both are designated similarly as substrates 106, the circuitry formed on the substrates 106 may be similar or differing, depending on the particular stacked device formed from the substrates.

Typically, the integrated circuitry layer is formed to a depth of approximately 10 microns. Formed on the active surfaces 112 of substrates 106 are interconnect structures 104, which may comprise a plurality of copper structures, for example, and although illustrated as a plurality of interconnect structures, they may additionally comprise multiple layers of conductive traces. Interconnect structures 104, which may alternatively be referred to as copper lines, may be raised with respect to the top surfaces 114 of the dielectric layers 108, in at least one embodiment. Stacked device 100 may be formed by any number of well-known fabrication techniques, but it is important to note that the claimed subject matter is not limited in this respect. As shown on stacked device 100, portions of the substrates 106 may not be structurally supported, and, additionally, the interconnect structures may be exposed, resulting in oxidation, for example, depending on the type of material(s) used to form the interconnects.

Stacked device 101 illustrates an additional phase in the formation of a filler, comprising a first material 126. The first material 126 may be formed between substrates 106, and may be formed on a portion of the top surface 114 of at least one of the dielectric layers 108, for example. Formation of the first material may be performed by any number of methods, but one such method comprises diffusion, which may result in a liquid material diffusing into a particular area. Another method of formation may be mass material transport by capillary action, which may result in liquid migrating between substrates. In one embodiment, one side of a stacked device, such as opening 110, may be at least partially immersed in a first material, wherein the first material comprises a liquid. The first material may migrate at least partially between the substrates by capillary action, for example, depending on particular material properties such as viscosity. Alternatively, the stacked device 101 may be fully submersed in a first material, and the material may subsequently flow between the substrates and be deposited on at least a portion of the exposed surfaces of the device, for example. Additional methods of formation are in accordance with certain embodiments, explained in more detail hereinafter. Numerous materials or combinations of materials may be utilized to form the first material 126. Examples of suitable materials may include, for example, monomers or monomer solutions, such as a diisocyanate monomers or diisocyanate end-capped compliant oligomers, but any material or combination of materials that have the capability to be formed between two or more substrates of a stacked device, and/or exhibit desirable material properties for the purposes described herein may be used in at least one embodiment.

Stacked device 103 illustrates an additional phase of formation of a stacked device filler, comprising a second material 128. As shown on stacked device 103, a second material 128 is formed such that it is in contact with at least a portion of the first material 126. Forming the second material such that the material is in contact with at least a portion of the first material may cause a reaction, such as polymerization, which may produce outgassing within a polymer matrix, creating a polymer foam, for example, such as a polystyrene, polyester, or polyurethane. The foam material may serve as a filler material providing structural support and/or insulation to the stacked device. Forming of second material 128 may comprise a number of methods, but diffusion or material injection are two examples. Additionally, device 103 may be submersed in a material such as a second material, wherein the second material comprises a liquid. Submersion may cause the second material 128 to flow at least partially between the substrates and come in contact with the first material 126. Numerous techniques may be used to deposit a second material, and similarly, numerous materials may be used as a second material. Examples of suitable materials may include, for example, water, hydroxyl end-capped oligomers, carboxylic acid end-capped polymers, or one or more gases. It is important to note, however, that the material or combination of material used as a second material are not limited to these examples, but may comprise any material(s) that are capable of initiating a reaction, such as polymerization, and causing a filler material to be formed, and will depend at least in part on the composition of first material 126.

Stacked device 105 illustrates an additional phase of formation of a stacked device filler. Device 105 illustrates a fill material 130, formed at least in part from a combination of first material 126 and second material 128. The material composition of fill material 130 may vary depending on the material or combination of materials used as the first and second material. Fill material may be a byproduct of a reaction between the first material and the second material. For example, if a diisocyanate material is used as the first material, water may be used as a second material, resulting in the formation of a polymer foam as the fill material 130. Similarly, a diisocyanate monomer may be used as first material 126, and may be diffused between the substrates 106. A carboxylic acid end capped polyester may then be deposited on a portion of the first material 126, which causes a reaction resulting in the production of polymer foam. Additional reactions or material combinations may be used to form fill material 130, and specific embodiments may be described in more detail hereinafter.

In an alternative embodiment, a second material 128 is not used to cause a reaction and result in the production of a fill material 130, but only a first material 126 may be deposited between the substrates 106. Depending on the material or combination of materials used as a first material 126, a reaction may be caused by heating the first material, or may be caused by introducing the material to a lower pressure, such as ambient pressure, for example. In this embodiment, a polymer material, such as polystyrene, may have a gas such as nitrogen gas dissolved substantially within the polystyrene at a pressure greater than ambient, such as 1-2 times greater. This gas may be referred to as a blowing agent. The polymer material may be formed at least partially between two or more substrates, while the pressure greater than ambient. Once formation is substantially complete, the pressure may be allowed to return to ambient, and the blowing agent will expand, creating-a polymer foam. As an additional example of this alternative embodiment, a blowing agent such as p-toluenesulfonyl semicarbazide may be formed between the substrates 106, and subsequently heated to a particular temperature until a reaction occurs in at least a portion of the blowing agent. Additionally, a combination of a first and second material, and a heating process or introduction to a gas may be used in other alternative embodiments.

Figure 2:
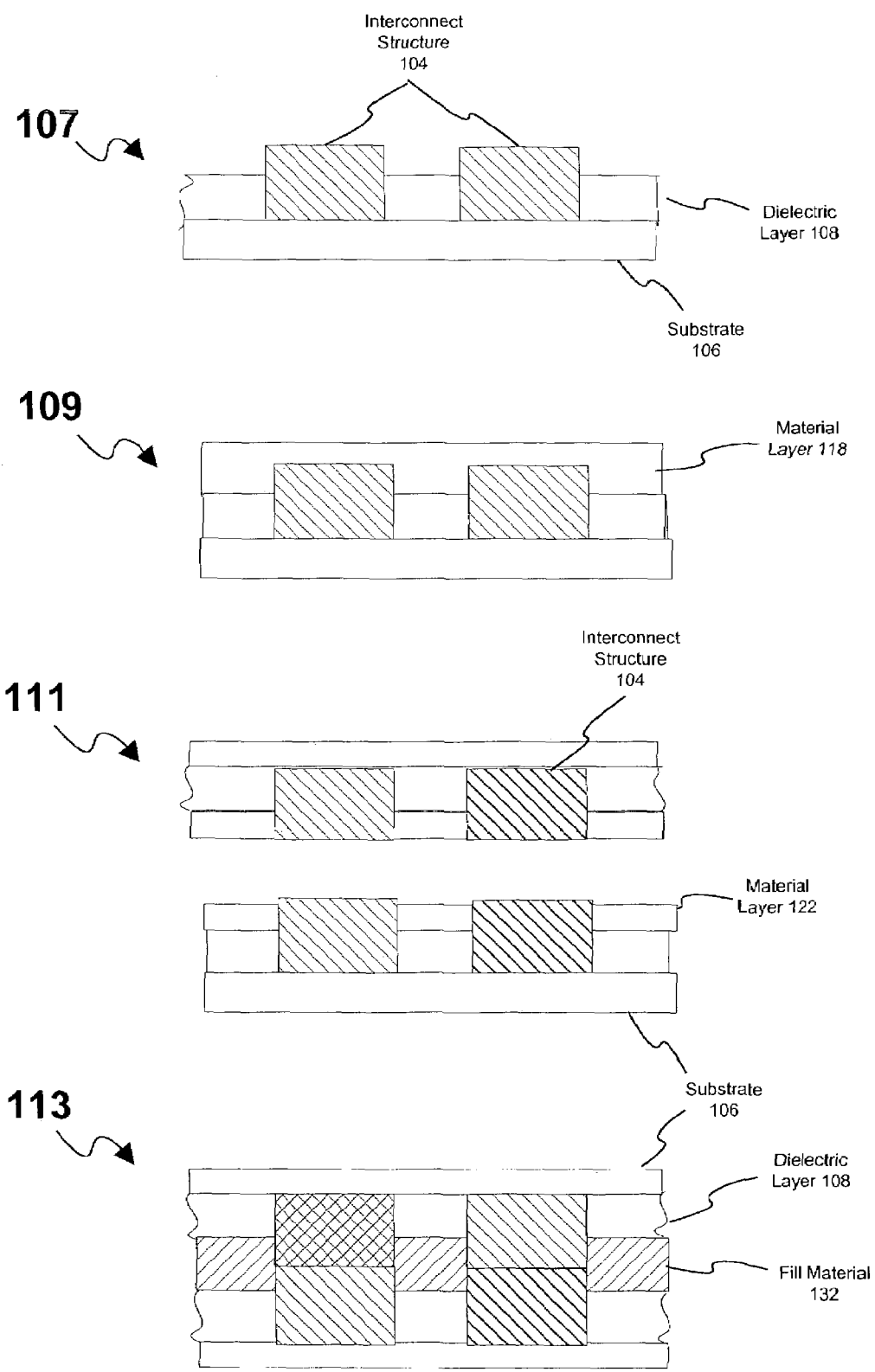
FIG. 2 illustrates several phases of formation of a stacked device filler in accordance with at least one embodiment.

FIG. 2 illustrates several phases of formation of a stacked device filler in accordance with an additional embodiment. Illustrated in FIG. 1 is device 107; which may comprise a substrate 106 with a dielectric layer 108 and a plurality of interconnect structures formed thereon. Similarly to the substrates illustrated in FIG. 1, substrate 106 may comprise semiconductor substrate such as silicon substrates, for example, and may comprise a portion of a silicon wafer after patterning of interconnects and formation of a dielectric layer, for example. Substrate 106 may have an active surface 112, and one or more integrated circuitry layers, which may contain integrated circuitry not shown in detail. Interconnect structures 104, which may alternatively be referred to as copper lines, may be raised with respect to the top surface 114 of the dielectric layer 108.

Device 109 illustrates an additional phase of formation of one embodiment of a stacked device filler. Device 109 comprises a substrate 106, and a dielectric layer top surface 114 with a material layer 118 formed thereon. The material layer 118 may comprise a number of materials or combination of materials, but in two particular embodiments, the material layer may comprise a polymer material, or a polymer material and a blowing agent in combination. Methods of forming a material layer on the dielectric layer top surface may vary, depending at least in part on the material(s) used as the material layer 118, but one particular method comprising spin coating the material layer 118 on the dielectric layer top surface to a thickness greater than the thickness of the exposed portions of the interconnect structures 104, for example. Numerous additional methods of forming a material layer 118 are in accordance with varying embodiments, as will be explained in more detail hereinafter.

Devices 111 comprise two devices such as device 109, which may have been formed by use of one or more similar or differing methods, such as those described herein. As shown in devices 111, a portion of the material layers 118 have been selectively removed, in order to expose at least a portion of the interconnect structures 104. Depending at least in part on the material(s) used as a material layer 118, removal may be a selective removal, and may be accomplished by use of a variety of methods, and may depend at least in part on the type of material or combination of materials used to form the material layer 118. Examples of such methods of removal may comprise a chemical mechanical polishing process (CMP), which comprises the use of one or more chemicals and one or more mechanical processes in order to remove particular portions of a layer of material, for example, or a dry etching process, such as reactive ion etching (RIE), although numerous other methods of removal exist, including grinding or spin etching. The material layer 118 may be selectively removed, or polished back, such that a substantial portion one or more of the interconnect structures 104 are exposed, and in one particular embodiment, the material layer may be polished back such that the top surface of the material layer is slightly lower than the top surface of one or more interconnect structures 104, for example.

Stacked device 113 illustrates two substrates each with a dielectric layer, a plurality of interconnect structures and a fill material 132 formed therebetween. The two substrates 106 may be aligned such that the interconnect structures are substantially opposing. The interconnect structures 104 may then be placed in physical contact, and may subsequently be bonded, and this may be a result of material creep, for example. In one embodiment, the interconnect structures may be bonded by elevating the temperature of the structures, although, of course, the claimed subject matter is not so limited. After bonding of the interconnect structures, a reaction may be caused in the two material layers shown formed on devices 111, which may produce fill material 132. The reaction may be a result of introducing a reactant to the material layers, such as by diffusing a material between the material layers. Additionally, no material may be introduced, but a reaction may be caused by elevating the temperature of the material layers, or by introducing a gas to the material layers, for example. Methods of forming the fill material 132 may vary, and will be explained in more detail hereinafter. In one exemplary embodiment, the material layers 118 may be formed a polymer precursor with an incorporated blowing agent, and the material layers 118 may be heated to a particular temperature after formation, selected such that it results in causing an outgassing within a polymer matrix, resulting in the production of a polymer foam incorporated between the substrates 106.

Figure 3:
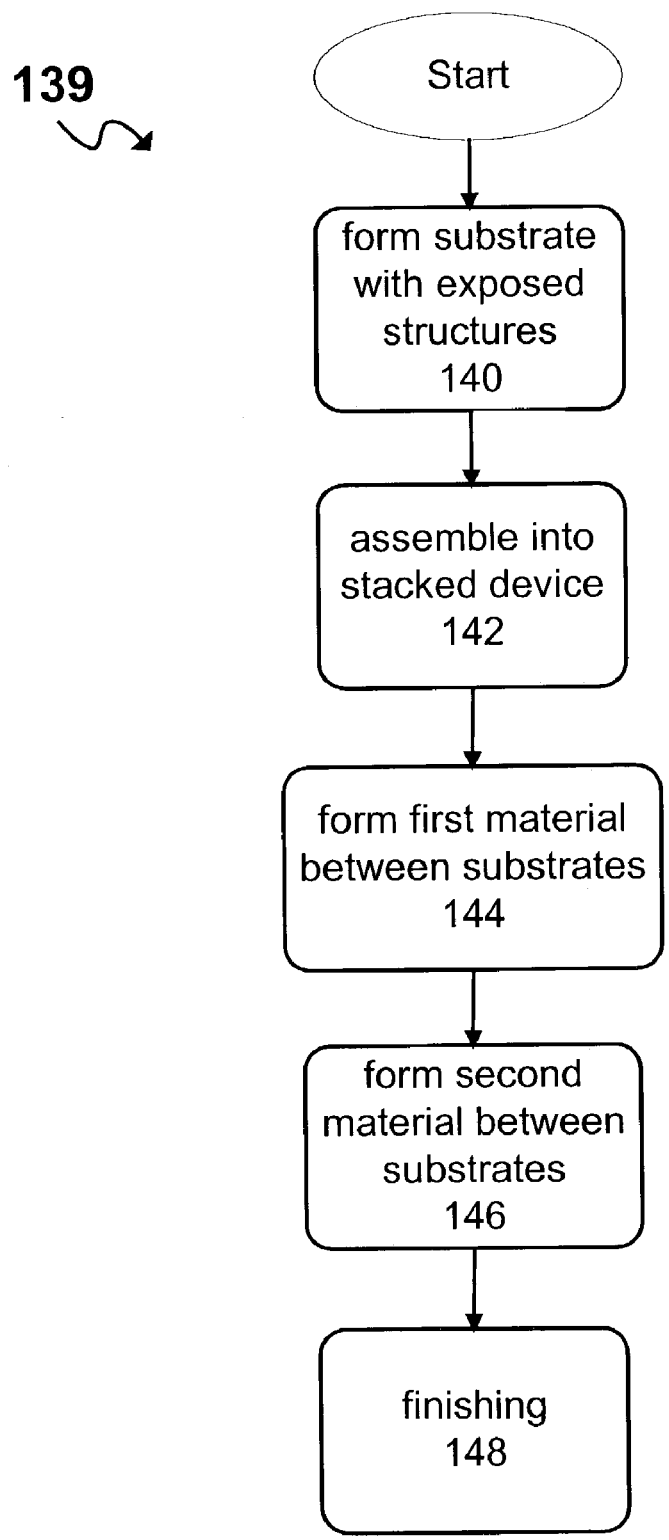
FIG. 3 is a process flow diagram illustrating one method of formation of a stacked device filler in accordance with at least one embodiment.

FIG. 3 illustrates a process flow diagram illustrating the processes used to form a stacked device with an underfill in accordance with at least one embodiment. The flowchart 139 illustrated in FIG. 3 may be used to substantially perform the phases of formation illustrated in FIG. 1, for example, although the process flow is not limited in this respect, and the order in which the functional blocks are presented do not necessarily limit the claimed subject matter to any particular order, and several intervening functional blocks may be used within the scope of the claimed subject matter. In this embodiment, one or more substrates with exposed structures are formed at functional block 140; the one or more substrates are assembled into a stacked device at functional block 142; a first material is formed between the substrates at functional block 144; a second material is formed between the substrates at functional block 146; and the stacked device is finished at functional block 148.

In one embodiment, at functional block 140, formation of one or more substrates with exposed structures may comprise forming a substrate with a plurality of interconnects, which may comprise a silicon wafer, for example, wherein the silicon wafer may have an active surface with one or more layers of circuitry bonded to the interconnects, for example, and the circuitry may comprise a CPU, ASIC, or an Intel StrataFlash® memory device, for example. Many methods of formation of a substrate such as described exist, and the claimed subject matter is not limited in this respect. A substrate such as illustrated as part of stacked device 100 of FIG. 1 may be formed by use of one or more of these well-known methods, for example.

In one embodiment, at functional block 142, assembly of the stacked device may comprise placing two or more substrates formed at functional block 140 into physical contact, where the interconnect structures are typically in physical contact. Numerous methods of assembly of a stacked device may be used, including alignment and bonding of interconnect structures, as described previously, but the claimed subject matter is not limited to any particular method of assembly.

In one embodiment, at functional block 144, forming a first material may comprise one or more deposition processes that result in the depositing of one or more layers of a material or combination of materials on a substantial portion of a substrate. However, numerous additional methods exist, including diffusion, material injection, one or more spray processes, or submersion of the stacked device, for example, and may include any method resulting in the formation of a first material between at least a portion of two or more substrates of a stacked device. It is additionally important to note that methods of formation may depend at least in part on the material or combination of materials used to form the first material. Materials may include, for example, diisocyanates such as diisocyanates monomers or a diisocyanate end-capped compliant oligomer, or blowing agents such as p-toluenesulfonyl semicarbazide, for example. In one particular embodiment, a portion of a stacked device may be immersed in a solution containing diisocyanate monomers, and the solution may diffuse at least partially between the substrates.

In one embodiment, at functional block 146, forming a second material may comprise one or more deposition processes that result in the depositing of one or more layers of a material or combination of materials on a substantial portion of a the first material formed at functional block 144. However, numerous additional methods exist, including diffusion, material injection, one or more spray processes, or submersion of the stacked device, similarly to the formation of the first layer. It is important to note that methods of formation may depend at least in part on the material or combination of materials used to form the second material, and may also depend at least in part on the material or combination of materials used to form the first material. Materials suitable for use as a second layer in particular embodiments may include, for example, water or carboxylic acid end-capped polyester, but may include any material or combination thereof that causes a reaction, such as polymerization, in at least a portion of the first material, resulting in the production of a fill material, for example. Additionally, as stated previously, in an alternative embodiment, a reaction may be caused in the first material by elevating the temperature of the first material, in which case a second material would not be used to cause a reaction and produce a fill material.

In one embodiment, at functional block 148, finishing of the material layer may comprise subjecting the material layer to one or more curing processes, which may entail introducing the substrate with the material layer formed thereon to an elevated temperature for a particular period of time. Methods used for curing may vary, and depending on the material(s) used to form the material layer, no curing process may be performed, for example. Additionally, one or more finishing processes may include a removal of excess material, such as excess material used to form the fill material, for example. Methods of removal may depend on the composition of the fill material, but may include grinding, chemical mechanical polishing, or dry etching, as just a few examples.

Figure 4:
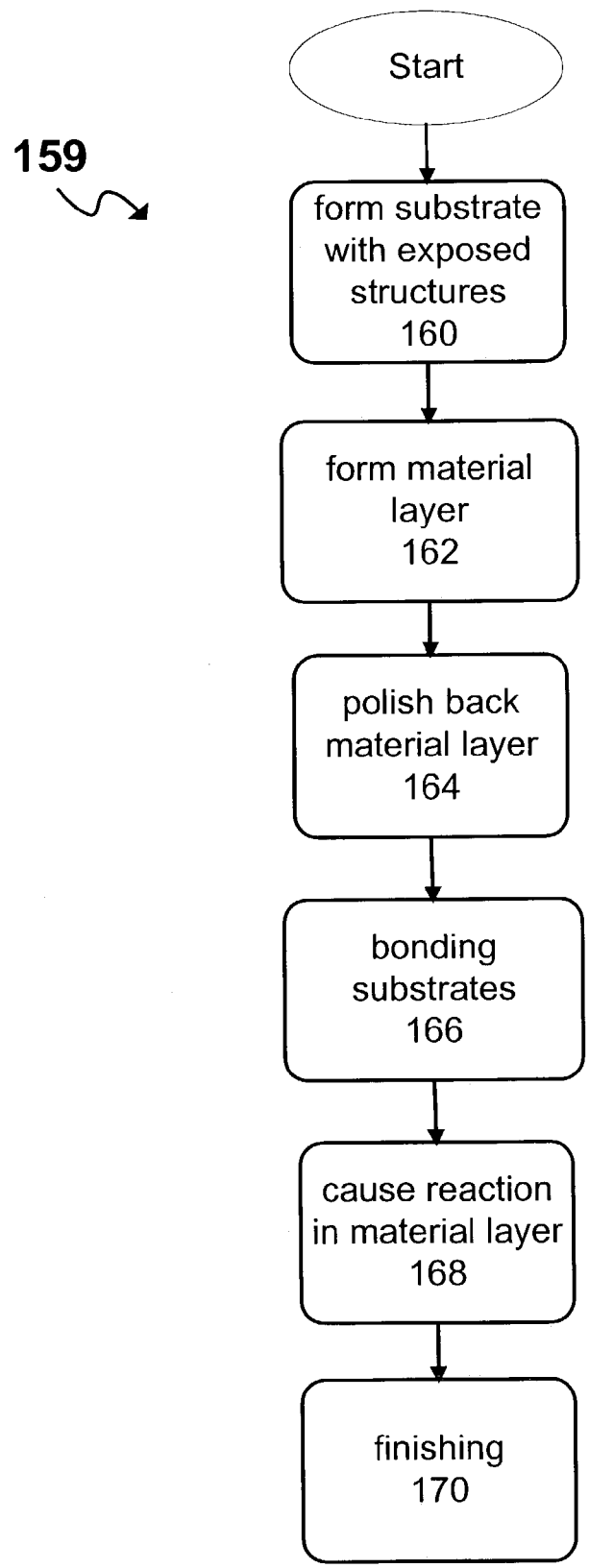
FIG. 4 is a process flow diagram illustrating another method of formation of a stacked device filler in accordance with at least one embodiment.

FIG. 4 illustrates a process flow diagram 159, illustrating the processes used to form a stacked device filler in accordance with at least one embodiment. The flowchart 159 illustrated in FIG. 4 may be used to substantially perform the phases of formation of a stacked device as illustrated in FIG. 2, for example, although the order presented does not infer a particular order nor limit the process flow to just these discrete functions. In this embodiment, one or more substrates with exposed structures are formed at functional block 160; a material layer is formed at functional block 162; the material layer is polished back at functional block 164; two or more substrates are bonded at functional block 166; a reaction is caused in the material layer at functional block 168; and the stacked device is finished at functional block 170.

In one embodiment, at functional block 160, formation of one or more substrates with exposed structures may comprise forming a substrate with a plurality of interconnects, which may comprise a silicon wafer, for example, wherein the silicon wafer may have an active surface with one or more layers of circuitry bonded to the interconnects, for example, and the circuitry may comprise a CPU, ASIC, or a memory device, for example. Many methods of formation of a substrate such as described exist, and the claimed subject matter is not limited in this respect. A substrate such as illustrated as phase 100 of FIG. 1 may be formed by use of one or more of these well-known methods, for example.

In one embodiment, at functional block 162, depositing a material layer may comprise one or more deposition processes that result in the depositing of one or more layers of a material or combination of materials on a substantial portion of a substrate. Such materials may include compliant materials including polymers, or a polymer material in combination with a blowing agent, for example. Methods of depositing the material layer may include, for example, spin coating, dip coating, or spray coating, for example, and may depend at least in part on the material or combination of materials used to form the material layer. In one embodiment, the material layer may comprise a polymer, and may be spin coated to a depth at least as great as the thickness of the exposed portion of the interconnect structures formed at functional block 160.

In one embodiment, at functional block 164, polishing back the material layer may comprise selective removal of the material layer by use of one or more mechanical and/or chemical processes, such as dry etching or a chemical mechanical polishing process, for example. Methods used for polishing back may depend at least in part on the composition of the material layer, and may comprise multiple processes, for example. The material layer, in one embodiment, may be selectively removed such that the top surface of one or more interconnect structures are exposed, for example, in order to allow for bonding of the interconnects to other substrate interconnects. In one embodiment, a portion of a layer of polymer may be selectively removed by using a chemical mechanical polish, which removes a portion of the polymer layer until the layer is slightly recessed in reference to one or more interconnect structures formed on the substrate, for example.

In one embodiment, at functional block 166, bonding the substrates, in one embodiment, may comprise placing these interconnect structures into physical and/or electrical contact, and may comprise application of pressure, and or an elevation of temperature to complete the bonding process.

The stacked device formed by use of the process as described above may be used as a stacked device with an underfill, for example.

In one embodiment, at functional block 168, a reaction may be caused in at least a portion of the material layer formed at functional block 162. The method or material used to cause a reaction will depend on the type of material or combination of materials used to form the material layer, but may include introducing a gas to the material layer, introducing a liquid to the material layer, or elevating the temperature of the substrate and material layer, for example. In one particular embodiment, a polymer in combination with a blowing agent may have been formed on the substrate, and then polymerization and outgassing may be induced by elevating the temperature of the substrate, for example, resulting in the production of a fill material.

In one embodiment, at functional block 170, finishing of the material layer may comprise subjecting the material layer to one or more curing processes, which may be introducing substrate with the material layer formed thereon to an elevated temperature for a particular period of time. Methods used for finishing may vary, and depending on the material(s) used to form the material layer, may or may not be needed, and may comprise removing excess fill material after a reaction has taken place, for example.

It can be appreciated that the embodiments may be applied to the formation of any stacked device filler. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still remain in accordance with the claimed subject matter. It is, therefore, to be understood that the appended claims are intended to cover all such modifications and changes as fall within the true spirit of the embodiments of the claimed subject matter.

The invention claimed is:

1. A method of forming a stacked semiconductor device, comprising:
    forming a layer of material on a portion of a top surface of a substrate, the substrate having an interconnect structure formed thereon;
    selectively removing a portion of the layer of material to expose a portion of a top surface of the interconnect structure;
    combining the substrate with another substrate to form a stacked semiconductor device;
    causing a reaction in a portion of the layer of material wherein a portion of the area between the two substrates is filled with a polymer foam as a product of the reaction.

2. The method of claim 1, wherein the reaction comprises polymerization.

3. The method of claim 1, wherein the forming comprises spin coating.

4. The method of claim 3, wherein the layer of material is spin-coated to a thickness greater than the top surface of the interconnect structure.

5. The method of claim 1, wherein the selective removing comprises one or more of: chemical etch, dry etch, or mechanical etch.

6. The method of claim 1, wherein the layer material is selected from the group consisting of: water, hydroxyl end-capped oligomers, and carboxylic acid end-capped polymers.

7. A method comprising:
    forming a layer of material on a substrate including an interconnect structure formed thereon;
    removing a portion of the layer of material such that a top surface of the layer of material is lower than a top surface of the interconnect structure to expose the top surface of the interconnect structure;
    combining the substrate with another substrate; and
    filling an area between the two substrates with a polymer foam as a product of a reaction in the layer of material.

8. The method of claim 7, wherein the reaction in the layer of material comprises polymerization.

9. The method of claim 7, wherein forming the layer of material comprises forming the layer of material to a thickness greater than the top surface of the interconnect structure.

10. The method of claim 7, wherein the layer material is selected from the group consisting of water, hydroxyl end-capped oligomers, and carboxylic acid end-capped polymers.

11. A method of forming stacked wafers, comprising:
    providing a first wafer having a first conductive interconnect structure and a first layer thereon, wherein at least a portion of the first conductive interconnect is exposed;
    providing a second wafer having a second conductive interconnect structure and a second layer thereon, wherein at least a portion of the second conductive interconnect structure is exposed;
    bonding the first conductive interconnect structure to the second conductive interconnect structure; and
    chemically reacting the first layer with the second layer by introduction of one of a reactant, heat or a gas to form a foam filling in an area between the first and second wafers adjacent to the first and second conductive interconnect structures.

12. The method of claim 11, further comprising:
    thinning at least one of the first and second wafers, the foam providing structural support to the stacked wafers during the thinning.

13. The method of claim 11, further comprising:
    protecting the first and second interconnect structures from oxidation using the foam during a subsequent wafer process.

* * * * *